(12) United States Patent
Fenouillet-Beranger et al.

(10) Patent No.: US 8,383,464 B2
(45) Date of Patent: Feb. 26, 2013

(54) METHOD FOR PRODUCING FIELD EFFECT TRANSISTORS WITH A BACK GATE AND SEMICONDUCTOR DEVICE

(75) Inventors: Claire Fenouillet-Beranger, Saint Martin d'Heres (FR); Philippe Coronel, Barraux (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 60 days.

(21) Appl. No.: 12/941,562

(22) Filed: Nov. 8, 2010

(65) Prior Publication Data
US 2011/0108942 A1 May 12, 2011

(30) Foreign Application Priority Data

Nov. 12, 2009 (FR) ..................................... 09 05438

(51) Int. Cl.
*H01L 21/00* (2006.01)
(52) U.S. Cl. ........ 438/149; 438/666; 257/347; 257/504; 257/E23.01

(58) Field of Classification Search ................... 257/347, 257/504; 438/149, 666
See application file for complete search history.

(56) References Cited

U.S. PATENT DOCUMENTS
2004/0140520 A1 7/2004 Kim et al.
2009/0212362 A1 8/2009 Cheng et al.

FOREIGN PATENT DOCUMENTS
JP   A-2006-210552   8/2006
JP   A-2007-134366   5/2007

*Primary Examiner* — Eva Yan Montalvo
(74) *Attorney, Agent, or Firm* — Oliff & Berridge, PLC

(57) ABSTRACT

The method for producing a field effect transistor on a substrate comprising a support layer, a sacrificial layer and a semi-conducting layer comprises forming an active area in the semi-conducting layer. The active area is delineated by a closed peripheral insulation pattern and comprises an additional pattern made from insulating material. The method also comprises etching the insulating material of the additional pattern to access the sacrificial layer, etching the sacrificial layer resulting in formation of a first cavity, forming a dielectric layer on a top wall of the first cavity, and depositing an electrically conducting layer in the first cavity. The closed peripheral insulation pattern is formed through the semi-conducting layer and the sacrificial layer.

7 Claims, 10 Drawing Sheets

B-B

METHOD FOR PRODUCING FIELD EFFECT TRANSISTORS WITH A BACK GATE AND SEMICONDUCTOR DEVICE

BACKGROUND OF THE INVENTION

The invention relates to a method for producing a field effect transistor on a substrate comprising a support layer, a sacrificial layer and a semi-conducting layer. The method comprises forming an active area in the semi-conducting layer, the active area being delineated by a closed peripheral insulation pattern and comprising an additional pattern made from insulating material, etching the insulating material of the additional pattern to access the sacrificial layer, etching the sacrificial layer resulting in formation of a first cavity, forming a dielectric layer on a top wall of the first cavity, and depositing an electrically conducting layer in the first cavity.

The invention also relates to a semiconductor device comprising a plurality of transistors on a substrate, each transistor being formed on one active area and associated with one ground plane.

STATE OF THE ART

Transistors integrated on a Silicon On Insulator (SOI) substrate generally present better performances than transistors integrated on a bulk substrate, in particular in terms of consumption. It is also acknowledged that a SOI transistor is more resistant to short-channel effects than a conventional transistor on a bulk substrate. However, the SOI transistor suffers from the floating body effect resulting from the accumulation of electric charges in the body of the transistor, i.e. the channel region of the transistor. The threshold voltages of such a transistor are therefore often difficult to control. To remedy this problem, a fully depleted transistor is used. In this case, the depletion area of the transistor occupies the whole thickness of the semi-conducting layer forming the channel.

FIG. 1 represents a fully depleted field effect transistor on a SOI substrate. The SOI substrate successively comprises a support layer 1, a buried insulator layer 2 and a semi-conducting layer 3. Transistor 4 is formed in semi-conducting layer 3.

It is furthermore preferable to place a back gate under the buried insulator layer to modulate the body of the transistor thereby optimizing control of the channel by the gate, while at the same time further reducing the short-channel effects. The back gate is generally formed by an n-doped or p-doped semiconductor material arranged under the buried insulator layer with regard to the channel and/or to the drain and source regions. A contact on the back gate is necessary to apply a potential thereby making the threshold voltage of the transistor vary.

FIG. 2 represents two transistors, 4a and 4b, each comprising a back gate, respectively noted 5a and 5b. The transistors are formed from one and the same SOI substrate. The back gates are formed for example by a p-doped area under an NMOS transistor and an n-doped area under a PMOS transistor. The doped areas are formed in the support substrate and the back gate contact (doped area) is formed on the same surface of the substrate as the MOS transistors. The transistors are in conventional manner isolated from one another by insulation patterns 6, for example by Shallow Trench Isolation (STI). Trenches can also be used to separate the back gate or the semi-conducting layer contact.

Continuous improvement of integrated circuit performances, for example in terms of consumption and/or operating frequency, is ineluctably resulting in a constant reduction of the size of its components. Reduction of size then gives rise to insulation problems between back gates 5a and 5b. Trenches 6 are no longer sufficient to ensure this insulation.

FIGS. 3 to 5 represent steps of a method described in the document US2009/0212362. This method enables a field effect transistor 4 to be obtained on a SOI substrate. Transistor 4 comprises a back gate 5 electrically insulated from semi-conducting layer 3 and from any other back gates by a dielectric layer 11.

The method in particular comprises formation of insulation patterns 6 in the form of trenches in semi-conducting layer 3 of a SOI substrate. Patterns 6 are made for example from silicon oxide and the SOI substrate can be covered by a protective layer 7 (FIG. 3). Patterns 6 define active areas designed to receive the transistors. The method also comprises an ion implantation step through a mask 8 defined beforehand in a specific photolithographic step. Ion implantation, for example of germanium ions, damages a portion 9 of buried insulator by modifying the chemical composition and/or the structure of buried insulator layer 2. This portion 9 of damaged insulator can then be etched more quickly than the rest of buried insulator layer 2.

An insulation pattern 6 overlying damaged insulator portion 9 is removed by etching, as represented in FIG. 4. In the case of a silicon oxide pattern, etching can be performed by wet process, for example with a hydrofluoric acid (HF) solution. Damaged insulator portion 9 is also mostly etched using the same chemistry. A second etching, selective with respect to buried insulator layer 2, is used to remove the whole of portion 9 and form a cavity 10.

A dielectric layer 11 is then formed on the free surfaces of cavity 10 and of protective layer 7. Dielectric layer 11 is sufficiently thick to ensure electric insulation between semi-conducting layer 3 and the back gate subsequently formed in cavity 10.

As represented in FIG. 5, back gate 5 is formed in the cavity by deposition of a conductive material, for example a metal, or a doped semi-conductor, in particular polysilicon. Finally, a dielectric material plug 12 is deposited on back gate 5, in the opening corresponding to the etched insulation pattern.

Transistors 4a and 4b are then formed on the top surface of the semi-conducting layer, on each side of plug 12, in each of the active areas delineated by insulation patterns 6 and plug 12. Back gate 5 is common to the two transistors 4a and 4b in this embodiment.

In an alternative embodiment, each back gate can be dedicated to one transistor. The back gate underlies the channel of at least one transistor. It can also be situated under the source and a part of the drain of the transistor.

In a subsequent step of the method (not represented in the figures), the source and drain contacts of transistors 4a, 4b and the contact of back gate 5 are formed through a dielectric layer. Furthermore, the contact of back gate 5 passes through plug 12.

This method therefore enables the formation of transistors with an electrically independent back gate. However, such a method is long and difficult to implement. Furthermore, this method is particularly sensitive to metallic contamination problems when the back gate is made from metal. The method is also incompatible with formation of a back gate associated with one or more transistors, when the back gate underlies the whole of the effective active area of the transistor.

OBJECT OF THE INVENTION

The object of the invention is to provide a method for producing MOSFET transistors that is simple and easy to implement, comprising a limited number of photolithography steps and which if necessary allows perfect overlapping between the back gate and the active areas associated with the back gate.

According to the invention, this object is achieved by the fact that the insulation pattern is formed through the semi-conducting layer and sacrificial layer.

It is a further object of the invention to provide a reliable semiconductor device presenting a plurality of transistors, each transistor being associated with one ground plane, while at the same time reducing the risks of leakage between the ground planes.

According to the invention, this object is achieved by the fact that the active area and the ground plane are delineated by the same closed peripheral insulation pattern and by the fact that the device comprises, for each transistor, an additional pattern within the surface delineated by the closed peripheral insulation pattern to form a ground plane contact.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PARTICULAR EMBODIMENTS

The method according to the invention enables a field effect transistor to be produced on a substrate comprising a semi-conducting layer, a dielectric layer, an electrically conducting layer forming a back gate or a ground plane, and a support layer. The conducting layer is electrically insulated from the other layers by the dielectric layer.

Figure 1:
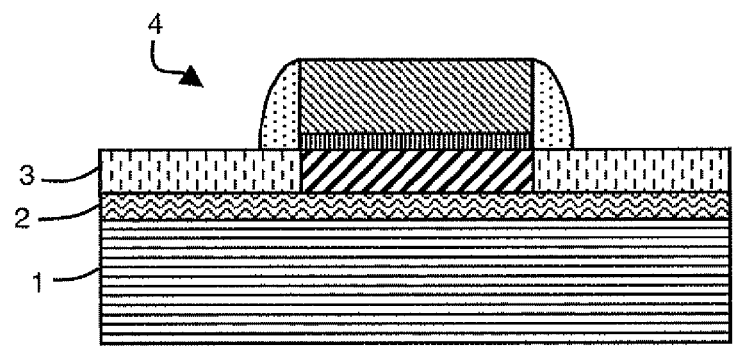
FIG. 1 schematically represents a transistor integrated on a SOI substrate according to the prior art, FIG. 2 schematically represents two transistors on a SOI substrate comprising back gates according to the prior art, FIGS. 3 to 5 schematically represent steps of a method for producing transistors with back gates according to the prior art, FIG. 6 schematically represents an initial substrate according to the invention.
Figure 2:
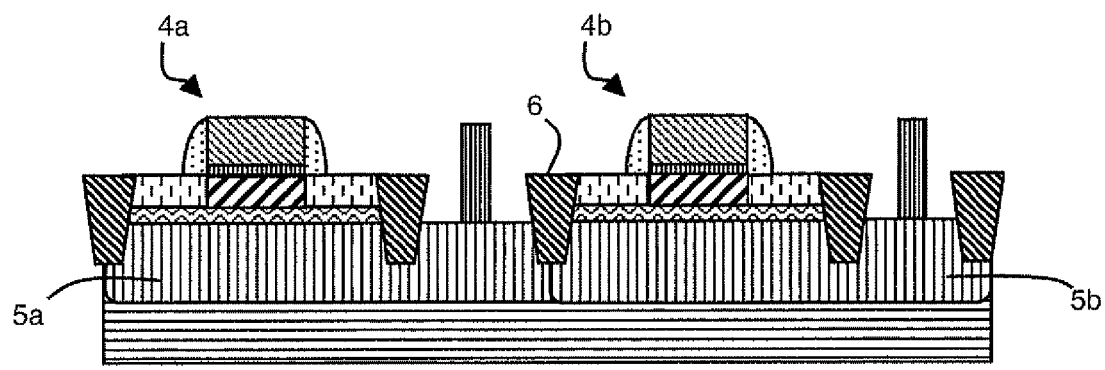
Figure 3:
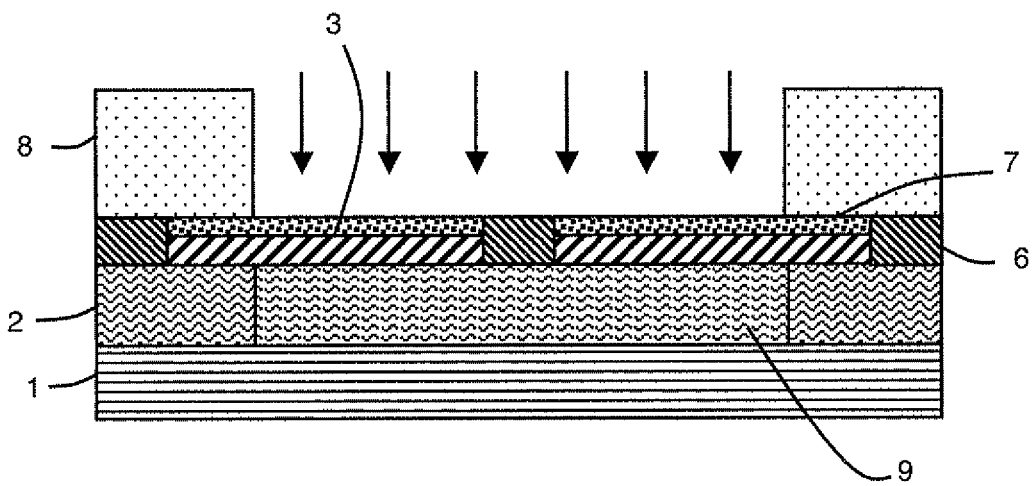
Figure 4:
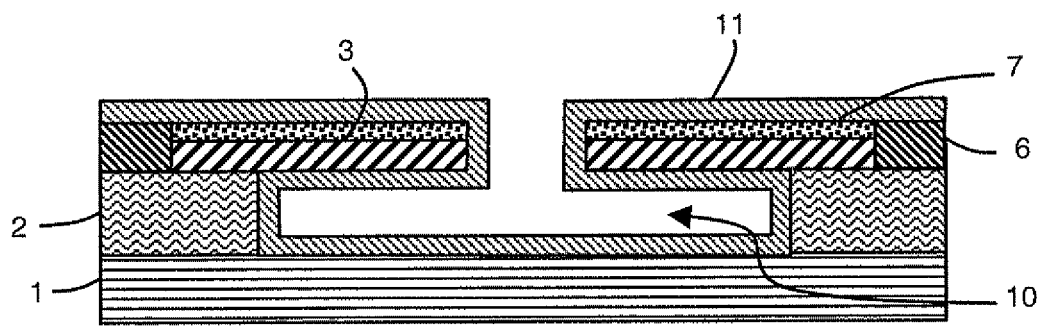
Figure 5:
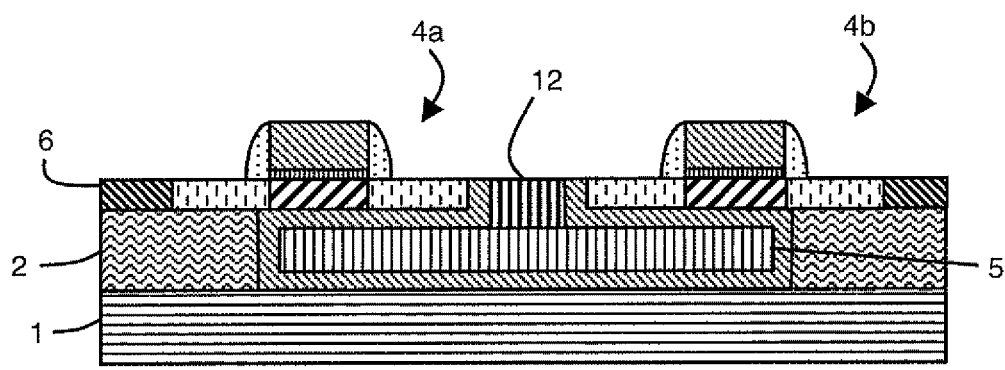
Figure 6:
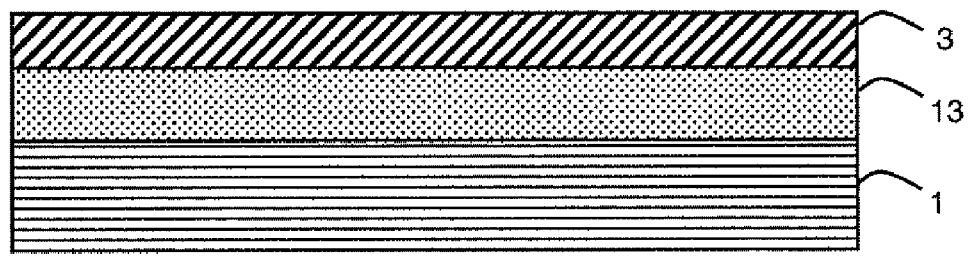

FIG. 6 represents an initial substrate comprising support layer 1, a layer 13 made from sacrificial material and semi-conducting layer 3. Support layer 1 is for example made from bulk silicon. Sacrificial layer 13 is for example made from germanium, doped silicon, silicon oxide $SiO_2$ or silicon nitride $Si_3N_4$. Sacrificial layer 13 is preferably made from silicon-germanium alloy SiGe.

SiGe layer 13 is formed for example by epitaxy on support layer 1. The germanium concentration preferably varies between 20% and 30% and the thickness of SiGe layer 13 is about 50 nm. Semi-conducting layer 3 is for example made from silicon or from silicon-germanium alloy and is formed by epitaxy on sacrificial layer 13. Its thickness is about 10 nm. For all the materials cited above, a method exists for etching sacrificial layer 13 selectively with respect to semi-conducting layer 3 and support layer 1.

Figure 7:
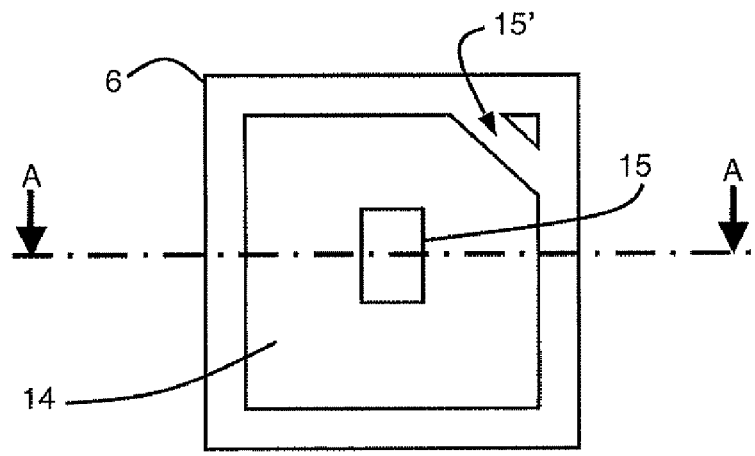
FIGS. 7 and 8 represent particular embodiments according to the invention in a schematic top view, FIGS. 9 to 18 schematically represent steps of a method according to one embodiment of FIGS. 7 and 8, in cross-section along the line A-A, FIGS. 19 to 21 schematically represent steps of an alternative embodiment of a method according to the invention corresponding to the steps of FIGS. 13 to 15, in cross-section along the line A-A.
Figure 8:
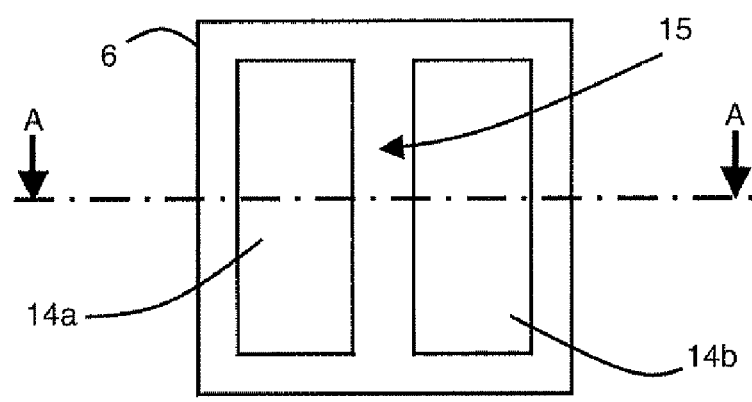

FIGS. 7 and 8 represent the arrangement of at least one active area 14 with respect to an insulation pattern 6, in top view.

The active area, formed in the semi-conducting layer, is delineated by a closed peripheral insulation pattern 6 of any shape, for example a square in FIG. 7. In other words, closed peripheral insulation pattern 6 fixes the limits of the active area. The active area also comprises an additional pattern 15 formed at the same time as closed peripheral insulation pattern 6. In the embodiment of FIG. 7, additional pattern 15 is distinct from insulation pattern 6, for example situated in the center of insulation pattern 6.

Figure 22:
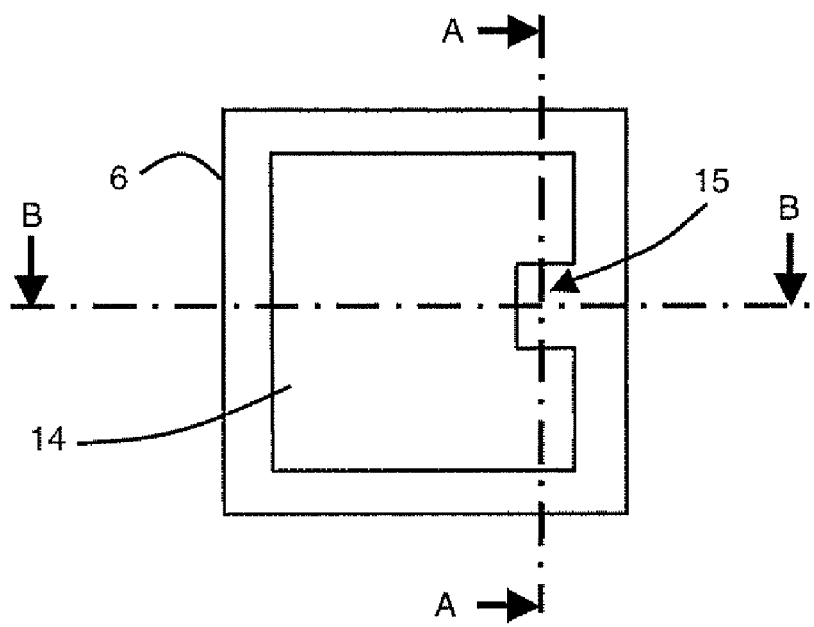
FIG. 22 represents another embodiment of a method according to the invention in a schematic top view, and the FIG. 23 schematically represents a step of a method according to the embodiment of FIG. 22, in cross-section along the line B-B.

FIGS. 8 and 22 represent other embodiments for formation of closed peripheral insulation pattern 6 and of additional pattern 15. In these embodiments, additional pattern 15 is in contact with a part of insulation pattern 6 and extends this part. The additional pattern can also be considered as forming part of closed peripheral insulation pattern 6.

In FIG. 8, additional pattern 15 for example joins two opposite sides of pattern 6. The active area is divided into two elementary active areas 14a and 14b separated laterally by pattern 15. Active areas 14a and 14b are electrically insulated from one another. Each elementary active area (14a and 14b) can then comprise a transistor. In this case, the two transistors will share the same back gate.

The additional pattern can also join two adjacent sides of pattern 6, such as pattern 15' represented in FIG. 7. In this case, the two elementary active areas do not have the same use. One of the two active areas presents an insufficient surface to enable integration of a MOS transistor.

In the embodiments in relation with FIGS. 7 and 22, active area 14 is a single area and can therefore comprise only one transistor.

Figure 9:
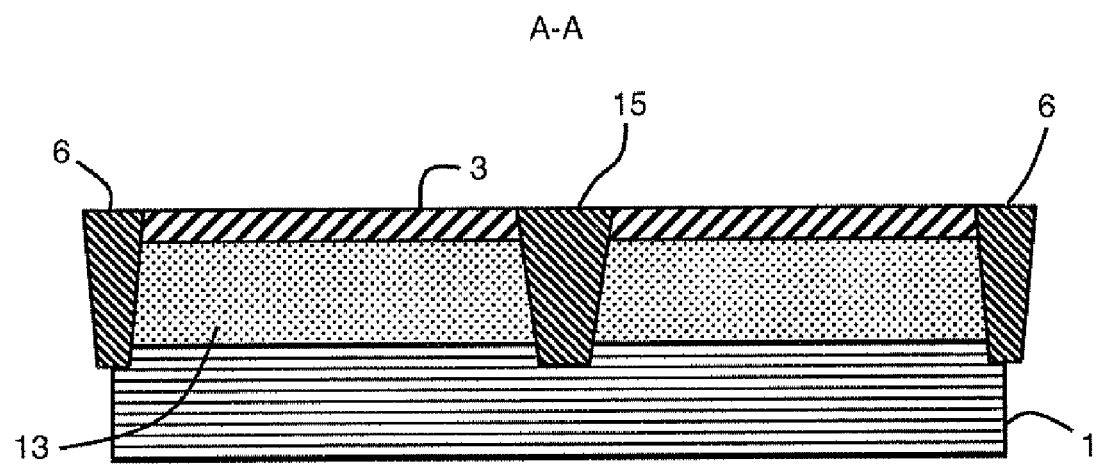

FIG. 9 represents a structure obtained according to one of the embodiments of FIGS. 7, 8 and 22, in cross-section along A-A. The structure comprises two insulation pattern areas 6 and an additional pattern area 15.

Insulation patterns 6 are preferably trenches formed by Shallow Trench Isolation (STI). The trenches are formed by a photolithography step followed by an etching step through semi-conducting layer 3, sacrificial layer 13 and a part of support layer 1. The trenches are then filled with an electrically insulating material, for example silicon oxide or another material such as silicon nitride.

Figure 10:
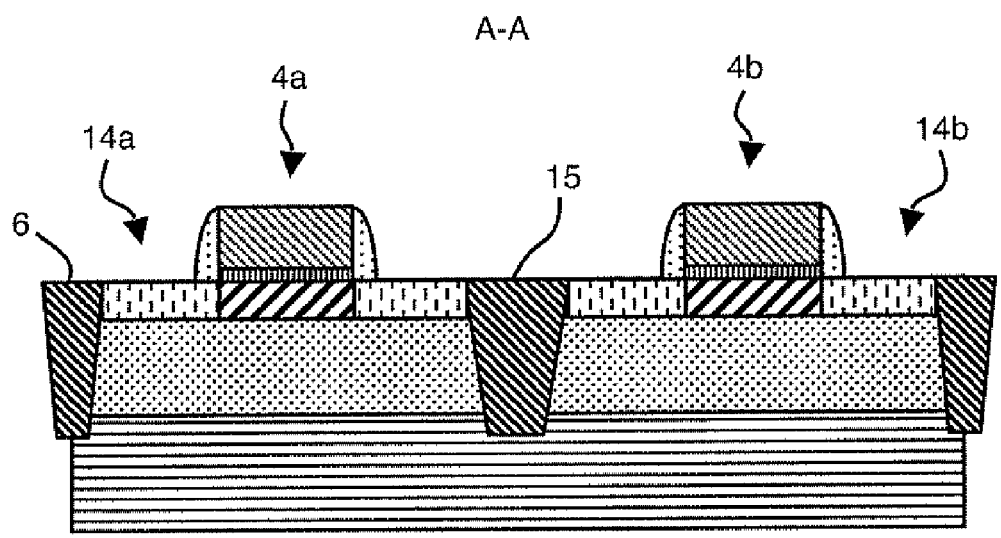
Figure 11:
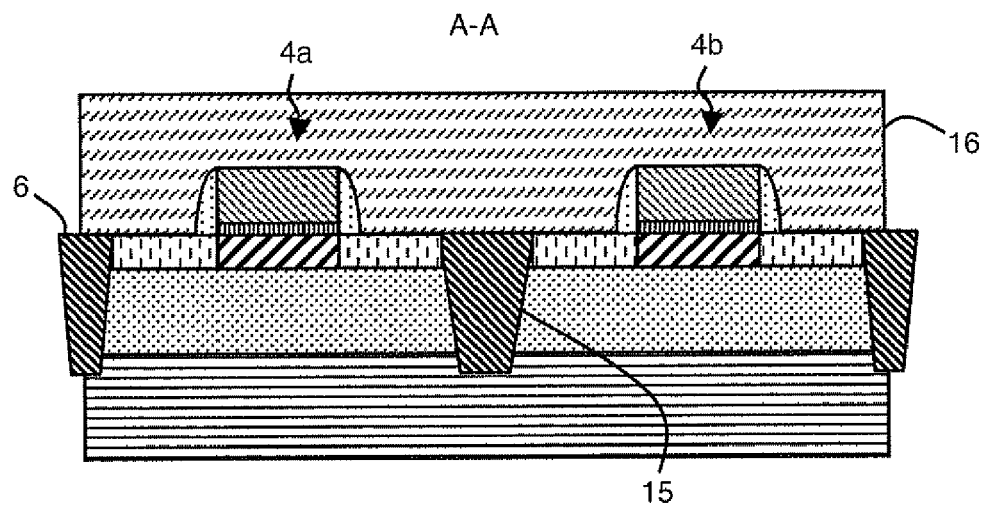
Figure 12:
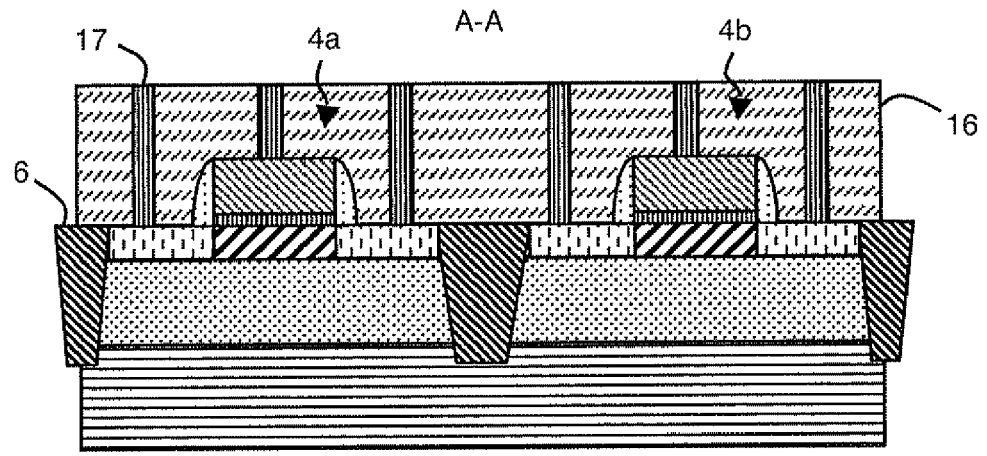

FIGS. 10 to 12 represent steps of a standard fabrication method of transistors, and also of the associated source, drain and gate contacts, after formation of the active areas, in the case of a pattern delineating two active areas.

FIG. 10 represents a formation step of at least one transistor 4, for example a transistor on each of active areas 14a and 14b defined beforehand by formation of peripheral pattern 6 and of additional pattern 15. Transistors 4a and 4b are formed in semi-conducting layer 3. Advantageously, transistors 4a and 4b occupy the active areas totally. The transistors can be of partially depleted or fully depleted type. In the example of FIG. 10, the transistors are fully depleted, and the transistor channels therefore occupy the whole thickness of the semi-conducting layer. The transistors are produced in conventional manner.

As illustrated in FIG. 11, transistors 4a, 4b, insulation pattern 6 and additional pattern 15 are covered by a dielectric material 16 designed to form an interconnection layer. In conventional manner, dielectric material 16 is chosen from low-k materials or from materials able to be eliminated to form an air gap structure.

FIG. 12 represents formation of drain, source and gate contacts 17 of the transistors by deposition of a metal, after dielectric material 16 has been etched.

Figure 13:
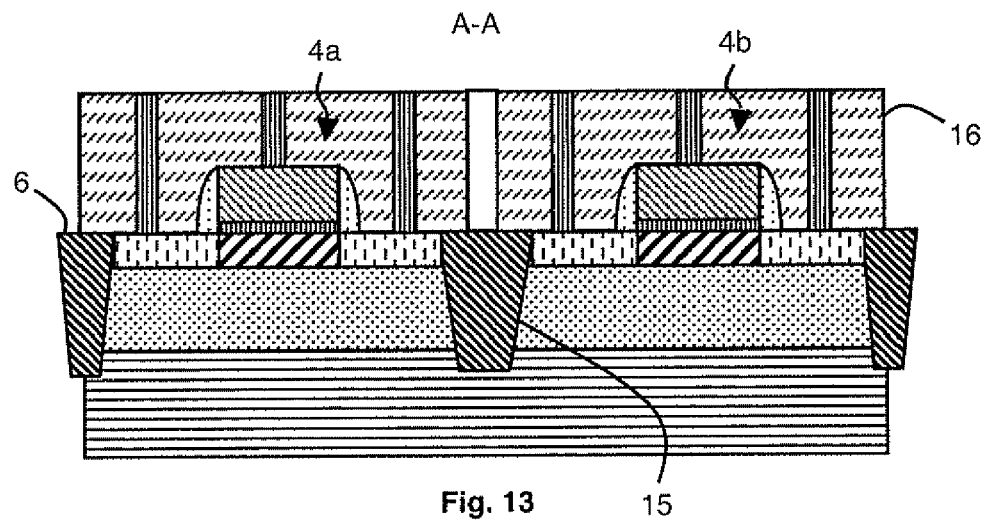

As represented in FIG. 13, dielectric material 16 is then etched to access a portion of additional pattern 15, here the central pattern located between transistors 4a and 4b. The etching method is advantageously identical to the one used for etching dielectric material 16 and for defining contacts 17. Dielectric material 16 is preferably etched in a single step to define contacts 17 of the transistor and achieve this access to additional pattern 15.

Figure 14:
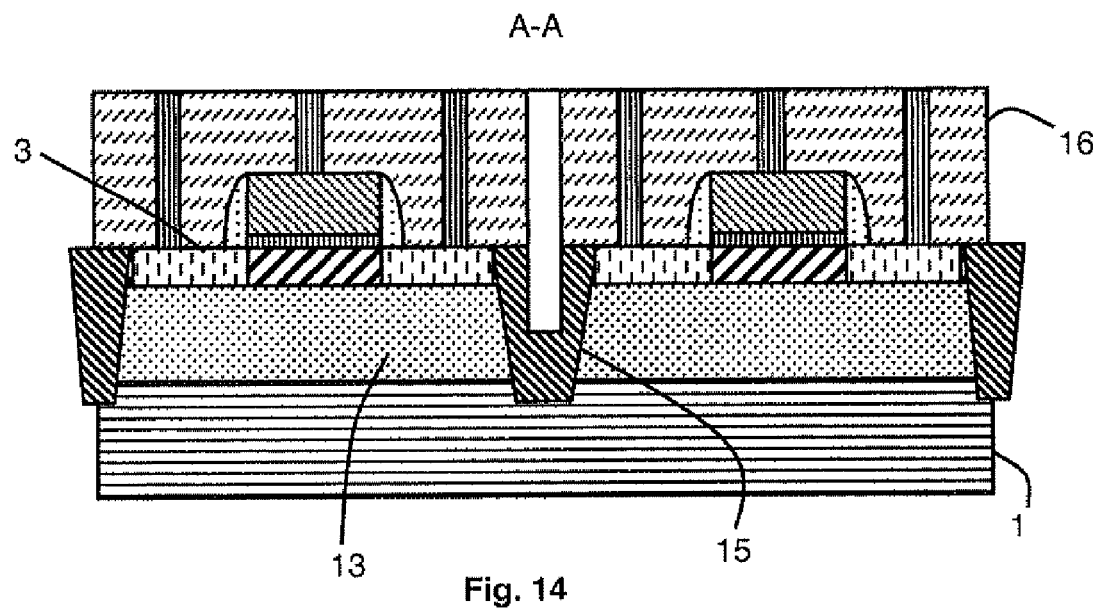
Figure 15:
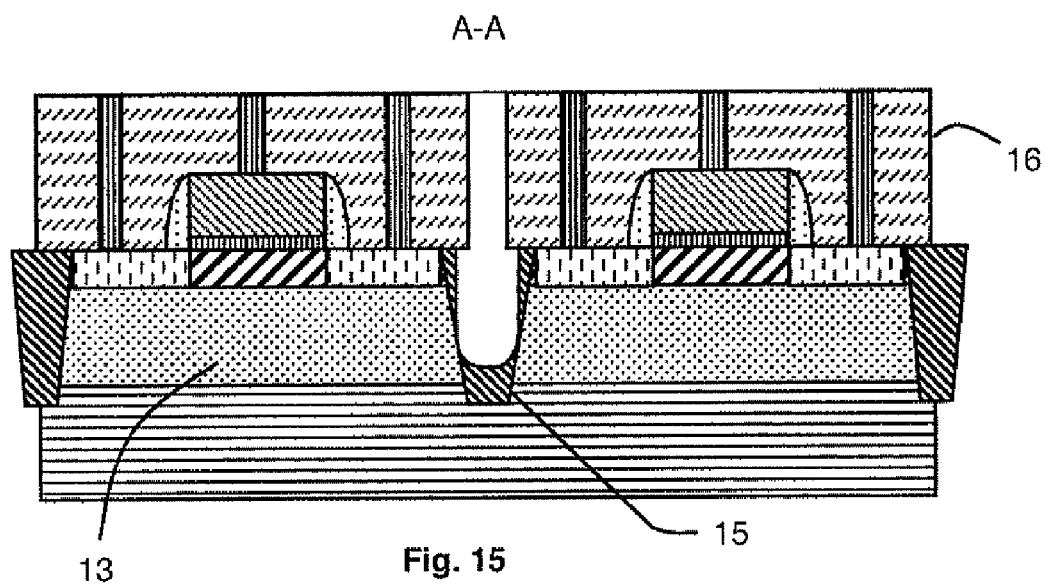

FIGS. 14 and 15 represent subsequent steps of the production method corresponding to etching of additional pattern 15, at least partly released by etching of dielectric material 16. Additional pattern 15 is etched so as to access sacrificial layer 13 located between semi-conducting layer 3 and support layer 1. Access can be obtained by means of anisotropic etching and/or isotropic etching of the material constituting additional pattern 15.

Etching of additional pattern 15 is advantageously performed in two stages. It comprises a first step of anisotropic etching through a part of additional pattern 15, represented in FIG. 14, and a second step of isotropic etching of additional pattern 15, represented in FIG. 15. The anisotropic etching, performed for example by plasma etching, reaches a predefined region of additional pattern 15. The isotropic etching reaches the edges of pattern 15 in contact with sacrificial layer 13 and thereby allows access to the sacrificial layer. The isotropic etching is for example performed by wet etching with a hydrofluoric acid base in the case of silica-base patterns 15. The etched depth when anisotropic etching is performed and the thickness eliminated by the isotropic etching depend on the geometric constraints relating to additional pattern 15 and on the volume of material constituting sacrificial layer 13 to be eliminated and then to be filled. For example, it may be necessary to form a large access area to the sacrificial layer to etch this layer quickly.

In a particular embodiment (not shown) which uses the same technological steps illustrated up to FIG. 13, a single isotropic etching is used to access the sacrificial layer. Only a top area of additional pattern 15 is therefore etched to allow access to the sacrificial layer. It is advantageous to use selective etching with respect to dielectric material 16 in order not to remove too much material 16 around contacts 17.

In a preferred embodiment, etching of dielectric material 16 and the first anisotropic etching step of pattern 15 are performed in a single step. Anisotropic etching is thus performed through dielectric material 16 and a part of additional pattern 15.

Figure 16:
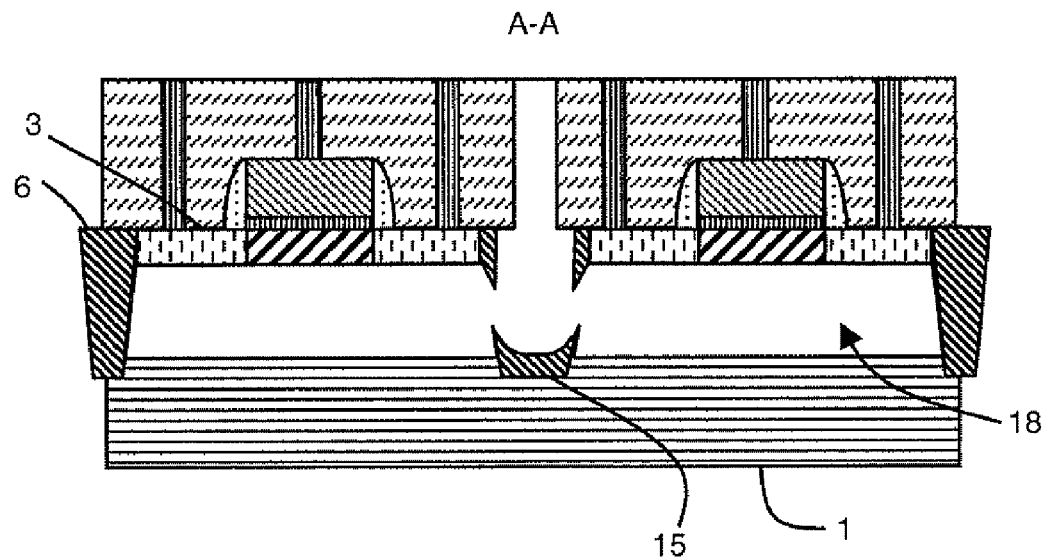

FIG. 16 represents the sacrificial layer etching step which results in a first cavity 18, after etching of additional pattern 15 has been performed. First cavity 18 is subsequently filled by the material forming the back gate. Etching can be partial, leaving for example a variable thickness of sacrificial material on the lateral surfaces of insulation patterns 6. Sacrificial layer 13 can also be totally etched.

In the case of a sacrificial layer 13 made from silicon and germanium alloy SiGe, selective etching of layer 13 with respect to semi-conducting layer 3, support layer 1 and insulation pattern 6 is performed for example by plasma etching or by hydrogen chloride vapor HCl etching. In the case of a sacrificial layer 13 made from silicon, plasma etching can be used on the condition that the sacrificial layer further comprises a stop layer, for example made from SiGe. First cavity 18 formed is self-aligned on the lateral surfaces of insulation patterns 6 if complete etching of the sacrificial layer is performed.

In an alternative embodiment, a layer of protective material is advantageously formed at the interface between the peripheral insulation pattern and the sacrificial layer. The protective layer covers at least an outer surface of the insulation pattern exposed to etching of the sacrificial layer. The protective layer preferably covers the lateral surfaces and the bottom surface of the peripheral insulation pattern. This protective layer is produced during formation of the insulation pattern by depositing the protective material on the bottom and side walls of the trench. The protective material is for example silicon nitride if the sacrificial layer is made from $SiO_2$. The protective layer has a thickness of about a few nanometers.

The protective material is advantageous as it forms an etch stop layer of the sacrificial layer, for example if the sacrificial layer is made from silicon oxide and etched by HF. The cavity formed is also self-aligned on the lateral surfaces of the insulation patterns. The protective layer is necessary if the sacrificial layer is made from the same material as the insulation patterns. The additional pattern being formed at the same time as the peripheral insulation pattern, the additional pattern also comprises the protective layer. Etching of pattern 15 then comprises a third step of removal of the protective material before the removal of the sacrificial layer.

Figure 17:
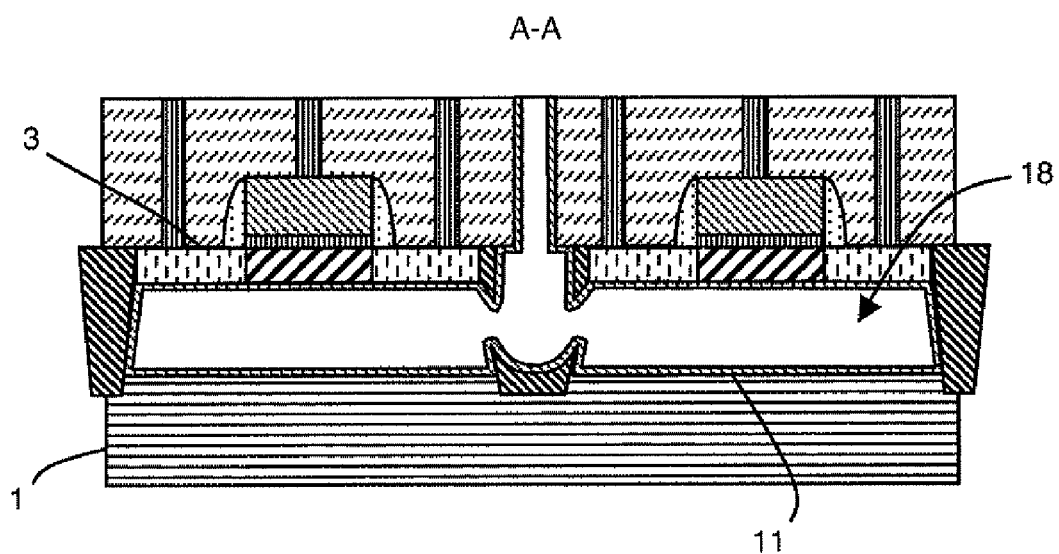

FIG. 17 represents the formation of dielectric layer 11 on at least a top wall of first cavity 18 i.e. on the bottom surface of layer 3. The dielectric layer can also cover all the walls of first cavity 18. A first technique for forming this layer 11 consists in depositing at least one insulating material on the walls of first cavity 18. The insulating material is for example silicon oxide $SiO_2$. The thickness of layer 11 is for example about 10 nm. The thickness of dielectric layer 11 is variable so as to position the back gate with respect to the transistors. In this way, it is chosen to modulate the body and/or the source and/or drain of the transistor with the back gate. Deposition of the insulating material of dielectric layer 11 is performed by any suitable technique, advantageously by PECVD. The deposition temperature is chosen to define a thermal budget compatible with the previously formed transistors. A second technique can be thermal oxidation of the remaining thin sacrificial layer or thermal oxidation of a part of semi-conducting layer 3 and possibly of support layer 1 if the thermal budget is sufficient. A combination of these thermal oxidations is also possible.

In an alternative embodiment, the sacrificial layer is formed by means of a first sacrificial material and a second sacrificial material. The first sacrificial material is arranged on the second sacrificial material. The second sacrificial material is etched to form the first cavity and the first sacrificial material forms the dielectric layer, after a thermal oxidation step. The first material is for example silicon-germanium and the second material is silicon. In this case, dielectric material 11 is only located underneath semi-conducting layer 3 over the whole surface of the active area. If support layer 1 is electrically conducting, the back gate is also insulated from layer 1 by an insulating material, for example obtained by oxidation of the first sacrificial material also located underneath the second sacrificial material.

Figure 18:
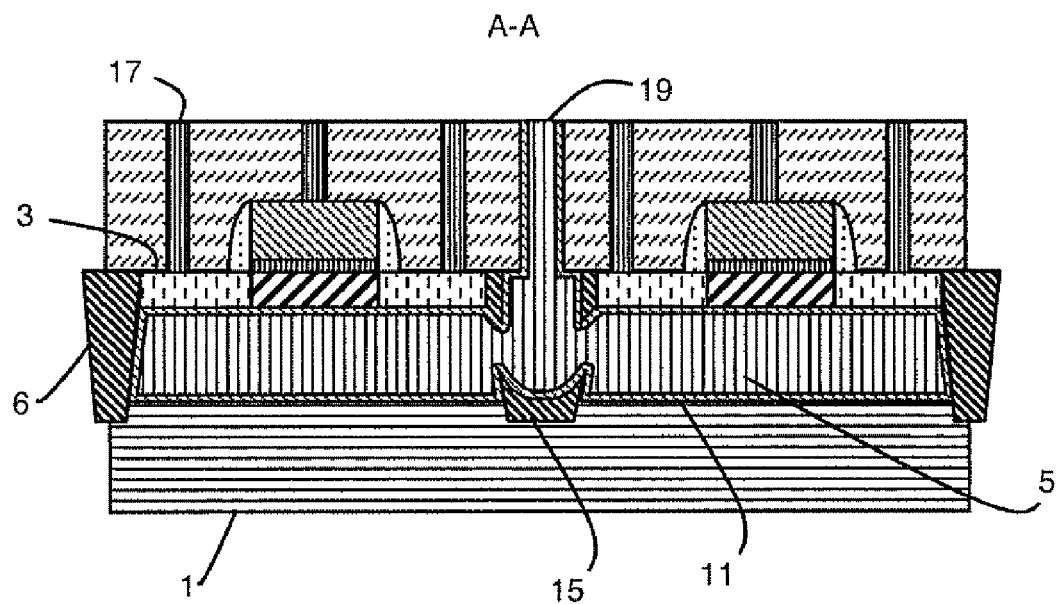

FIG. 18 represents deposition of the electrically conducting layer in the remaining first cavity thereby forming back gate 5 of the transistor. The conducting layer can be made from metal material (W, Ti, TiN, TaN, Cu) or from an n-doped or p-doped semi-conductor, for example polysilicon.

The material forming back gate 5 is advantageously identical to the material forming drain, source and gate contacts 17 of the transistors. In another embodiment, formation of the transistor contacts 17 can take place at the same time as deposition of the electrically conducting layer through the dielectric material 16. Likewise, a contact 19 of back gate 5 can be formed simultaneously with deposition of the electrically conducting layer. For example, after the etching step of dielectric material 16 represented in FIG. 12, a plug can be arranged on the surface of dielectric material 16 without the metal deposition having been performed. This plug is removed after formation of first cavity 18 and deposition of dielectric layer 11 to perform simultaneous deposition of contacts 17 and of back gate 5. Etching of dielectric material 16 to open the transistor contacts can also be postponed until after the formation of first cavity 18 and formation of layer 11.

A metal material for the contacts and the electrically conducting layer is preferred. Deposition of metal is made possible by the fact that the transistor was formed and then covered by the dielectric material 16 after formation of the active area and before etching of the additional pattern. The risk of contamination of the equipment by this metal is therefore reduced.

An embodiment could however be envisaged wherein the transistor is formed after etching of the sacrificial layer and deposition of the back gate formed by a doped semi-conductor for example. The person skilled in the art will then adapt the order of the fabrication steps.

Figure 19:
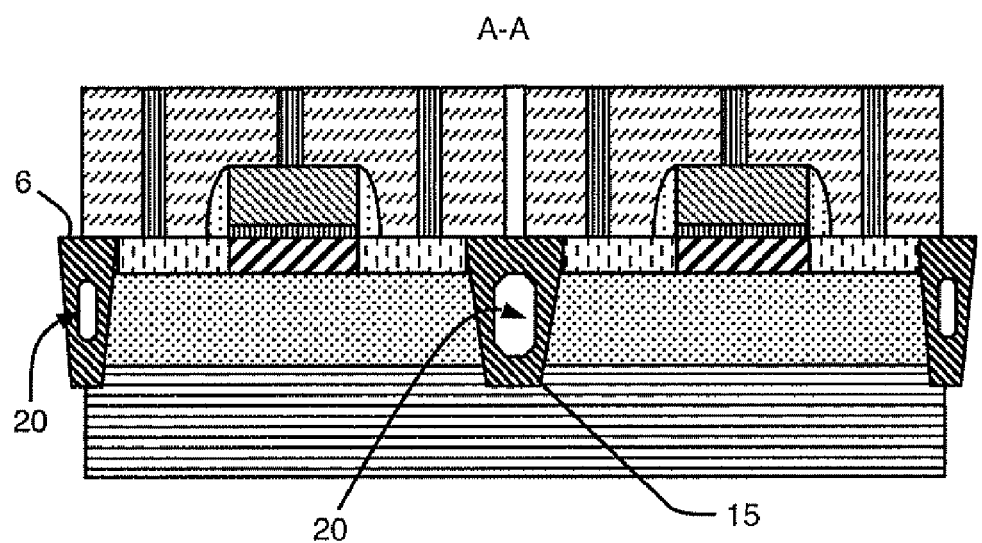
Figure 20:
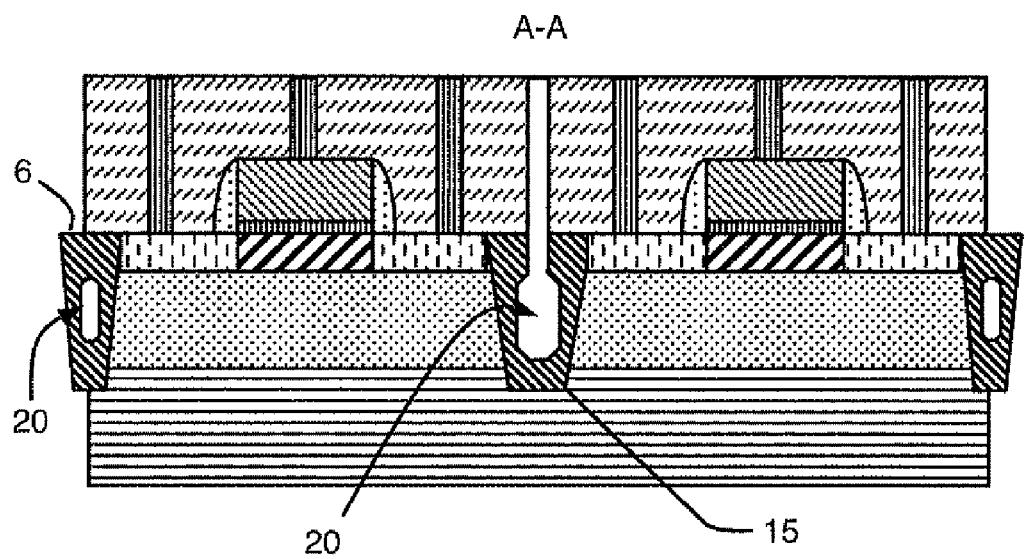
Figure 21:
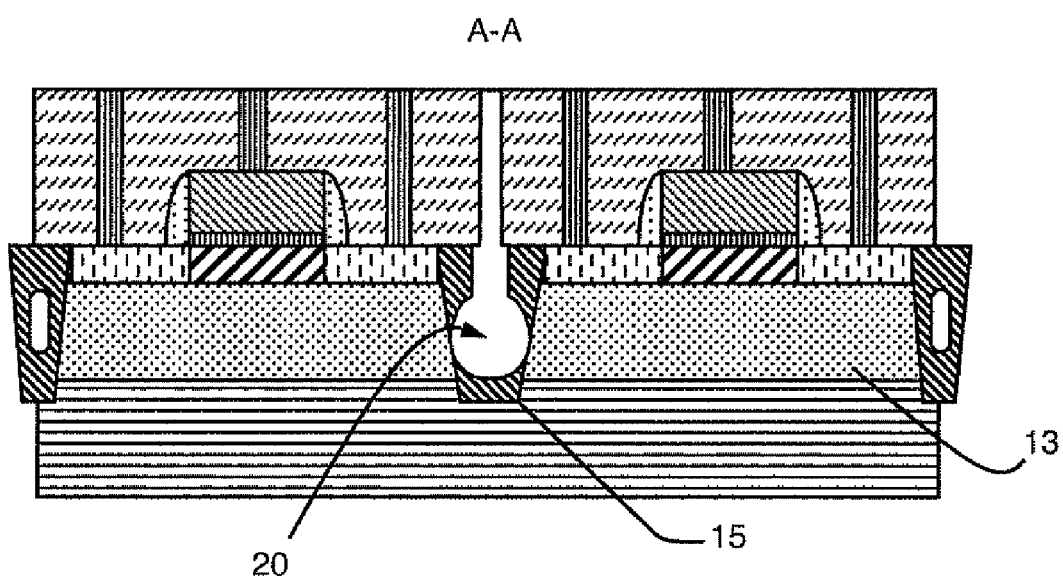

FIGS. 19 to 21 represent an alternative embodiment of the method which corresponds respectively to the steps illustrated in FIGS. 13 to 15. In this preferred embodiment, formation of the active area is designed to promote the formation of second cavities 20 in the closed peripheral insulation pattern 6 and additional pattern 15. The second cavity 20 can be formed during formation of patterns 6 and 15 by controlling the thickness of the insulating material deposited on the bottom and on the side walls of the patterns. The anisotropic etching then opens out onto second cavity 20 of additional pattern 15, as represented in FIG. 20. The isotropic etching (FIG. 21) broadens second cavity 20 until the second cavity reaches the interface between sacrificial layer 13 and pattern 15.

As described in the foregoing, isotropic etching of pattern 15 can be performed in a hydrofluoric acid HF bath. The presence of second cavity 20 inside the pattern is advantageous as it enables the etching time to be reduced. This is particularly beneficial when dielectric material 16 and the insulating material forming additional pattern 15 react to the same isotropic etching process. Isotropic etching of dielectric material 16 is then limited. A reduced etching time is also beneficial to prevent the insulating material forming additional pattern 15 from being completely removed.

Advantageously, additional pattern 15 has larger longitudinal and transverse dimensions, in a plane parallel to the substrate, than the smallest of the longitudinal and transverse dimensions of closed peripheral insulation pattern 6. In this way, second cavity 20 formed inside additional pattern 15 is larger than second cavity 20 formed inside closed peripheral insulation pattern 6 (FIG. 19). The thickness etched in isotropic manner to reach sacrificial layer 13 is thereby reduced compared with the previous embodiment. The rest of the method is performed as previously.

FIG. 22 represents another position of additional pattern 15 with respect to closed peripheral insulation pattern 6. In this embodiment, active area 14 is delineated by a closed peripheral insulation pattern 6. Peripheral pattern 6 presents a salient part directed towards the active area. This salient part forms additional pattern 15. Access to the sacrificial layer is achieved by means of pattern 15, as described in relation to FIGS. 13 to 15. However, additional precautions have to be taken when etching additional pattern 15, because the pattern 15 is in direct contact with pattern 6 which ensures insulation with respect to the adjacent active area. Additional pattern 15 is then etched, preferably leaving pattern 6 intact.

Figure 23:
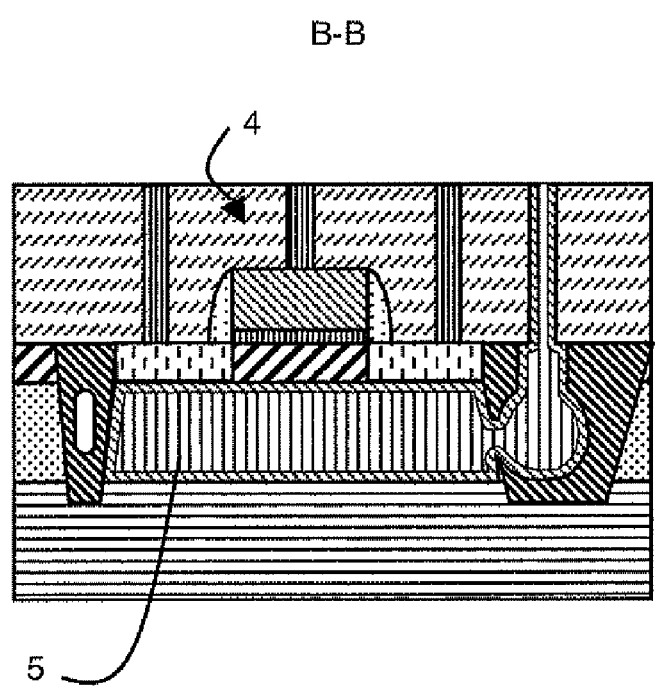

FIGS. 9 to 21 represent the structure obtained during steps of the method according to the embodiment of FIG. 22, in cross-section along A-A, whereas FIG. 23 represents the final structure according to embodiment of FIG. 22, in cross-section along B-B. The embodiment of FIGS. 22 and 23 is for example advantageous when a single transistor 4 is formed on the active area and is therefore dedicated to one back gate 5.

The method enables a semi-conductor device comprising a plurality of adjacent transistors on a substrate to be easily obtained. No ion implantation or photolithography steps specific to this implantation are used, unlike in the prior art. Misalignment problems and issue of the semi-conducting layer becoming amorphous are thus avoided.

The final device, represented in FIG. 23 according to the embodiment of FIG. 7, comprises one back gate 5 and one transistor 4 associated with one active area 14.

In these embodiments, each transistor is formed on one active area and comprises one ground plane. The active area and the ground plane of each transistor are delineated by the same closed peripheral insulation pattern. The potential imposed by the ground plane is thereby uniform over the whole of the active area, which further limits short-channel effects and improves electrostatic control of the channel. The device comprises an additional pattern of insulating material within the surface delineated by the closed peripheral pattern to form a ground plane contact.

This device is advantageous because the risks of leakage between the ground planes are avoided. Each ground plane is in fact delineated by the closed peripheral insulation pattern. Furthermore, the additional pattern, through which the ground plane contact passes, is comprised within the surface delineated by the closed peripheral pattern and extends down to a support layer arranged underneath ground plane 5. This enables a device having a high transistor integration density to be obtained.

In the case of FIGS. 8 and 18, the device comprises a first transistor formed on an active area 14a and a second transistor formed on an active area 14b. The active areas are separated by additional pattern 15 and associated with one and the same ground plane 5. Active areas 14a and 14b and the ground plane are delineated by closed peripheral insulation pattern 6 and by additional pattern 15. Additional pattern 15 is arranged inside the surface delineated by closed peripheral pattern 6 to form the contact of ground plane 5.

The invention claimed is:

1. Method for producing a field effect transistor comprising the following steps:
   providing a substrate comprising a support layer, a sacrificial layer, and a semi-conducting layer,
   forming a closed peripheral insulating pattern to delineate an active area in the semi-conducting layer wherein the closed peripheral insulating pattern extends through the semi-conducting layer and the sacrificial layer,
   forming an additional pattern made from an insulating material in the active area,
   after forming the active area and before etching the additional pattern, forming a transistor on the active area and covering the transistor by a dielectric material, etching the insulating material of the additional pattern to access the sacrificial layer, etching the sacrificial layer resulting in formation of a first cavity, forming a dielectric layer on a top wall of the first cavity, and depositing an electrically conducting layer in the first cavity.

2. The method according to claim 1, wherein etching the insulating material of the additional pattern is performed leaving the closed peripheral insulation pattern intact.

3. The method according to claim 1, wherein etching the additional pattern comprises a first anisotropic etching step through the dielectric material and a part of the additional pattern, and a second isotropic etching step of the additional pattern.

4. The method according to claim 1, wherein forming the closed peripheral insulating pattern and the additional pattern is designed to form second cavities in the closed peripheral insulation pattern and the additional pattern.

5. The method according to claim 1, comprising forming a layer of protective material at the interface between the closed peripheral insulation pattern and the sacrificial layer.

6. The method according to claim 1, comprising forming contacts of the transistor at the same time as depositing the electrically conducting layer, through the dielectric material.

7. The method according to claim 1, comprising forming the sacrificial layer by means of a first sacrificial material and a second sacrificial material, the first sacrificial material forming the dielectric layer and the second sacrificial material being etched to form the first cavity.

* * * * *